(12) United States Patent
Honda et al.

(10) Patent No.: US 7,724,054 B2
(45) Date of Patent: May 25, 2010

(54) GATE DRIVER WITH PROGRAMMABLE DEAD-TIME INSERTION

(75) Inventors: Jun Honda, El Segundo, CA (US); Xiao-Chang Cheng, San Jose, CA (US)

(73) Assignee: International Rectifier Corporation, El Segundo, CA (US)

( * ) Notice: Subject to any disclaimer, the term of this patent is extended or adjusted under 35 U.S.C. 154(b) by 1003 days.

(21) Appl. No.: 11/221,240

(22) Filed: Sep. 6, 2005

(65) Prior Publication Data

US 2006/0054938 A1   Mar. 16, 2006

Related U.S. Application Data

(60) Provisional application No. 60/607,873, filed on Sep. 8, 2004.

(51) Int. Cl.
*H03K 7/08* (2006.01)
(52) U.S. Cl. .................. 327/172; 327/175
(58) Field of Classification Search ......... 327/172–175, 327/427; 323/283, 224
See application file for complete search history.

(56) References Cited

U.S. PATENT DOCUMENTS 5,434,474 A * 7/1995 Ukita et al. ............... 315/128
6,515,439 B2 * 2/2003 Itoi ........................... 315/393
6,614,208 B2 * 9/2003 Narita ....................... 323/283

FOREIGN PATENT DOCUMENTS

| JP | 2003-037993 | 2/2003 |
|---|---|---|
| WO | WO 2004/044959 | 5/2004 |

\* cited by examiner

*Primary Examiner*—Dinh T. Le
(74) *Attorney, Agent, or Firm*—Farjami & Farjami LLP

(57) ABSTRACT

A dead-time generator for incorporation in an integrated circuit wherein the integrated circuit includes a high side and low side gate driver and wherein the high side and low side gate driver drive output switches such that a dead-time is provided between on times of the output switches, the dead-time generator comprising a circuit internal to the integrated circuit having an external terminal at which a dead-time setting component is connected, and wherein the dead-time generator comprises a circuit for providing a discrete dead-time for a range of dead-time setting values at the dead-time setting terminal and wherein, for a plurality of ranges of dead-time setting values at the dead-time setting terminal, the dead-time generator generates an associated plurality of discrete dead-times.

10 Claims, 4 Drawing Sheets

Proposed Method

Proposed Method

Dead-time vs Input voltage in conventional programmable dead-time

Dead-time vs Input voltage
in proposed discrete dead-time

GATE DRIVER WITH PROGRAMMABLE DEAD-TIME INSERTION

CROSS-REFERENCE TO RELATED APPLICATION

This application claims to the benefit and priority of Provisional Application Ser. No. 60/607,873 filed Sep. 8, 2004 and entitled GATE DRIVER IC WITH PROGRAMMABLE DEAD-TIME INSERTION, the entire disclosure of which is hereby incorporated by reference.

BACKGROUND OF THE INVENTION

The present invention relates to gate drivers, in particular, to gate drivers having dead-time insertion to prevent simultaneous conduction of two switches connected in a half bridge configuration. In particular, the present invention relates to a gate driver integrated circuit with programmable dead-time insertion.

Conventional methods that integrate a programmable dead-time generation circuit in an integrated circuit generally use a resistor external to the integrated circuit to set the amount of dead-time by, for example, setting an internal current reference to generate the dead-time. This is shown for example in FIG. 1 where the resistance R sets the dead-time generated by the dead-time generation circuit in the gate driver integrated circuit.

The conventional method of dead-time setting has the following disadvantages:

1. Because of the direct relationship between the external component value and the amount of the dead-time, this method is inherently prone to noise injection from the dead-time setting terminal of the integrated circuit. This is shown in FIG. 3 which shows a graph of dead-time versus input voltage in the conventional programmable dead-time circuit using a resistance connected to the dead-time terminal DT of the integrated circuit of FIG. 1.

2. The amount of dead-time is determined by both internal and external components, which have independent individual variations. Therefore, in order to ensure dead-time for shoot-through prevention purposes, it is hard to achieve precise dead-time values.

3. Internal and external circuits which determine the dead-time tend to have different temperature coefficients. The performance of the amplifier can be unstable with temperature change and/or it might go into thermal runaway if it gets into the shoot through region.

These problems become serious when the application needs a narrow dead-time, such as less than 100 nanoseconds for higher output linearity, for example, in Class D audio amplifiers.

SUMMARY OF THE INVENTION

According to the invention, the dead-time is set by selecting one of preset values determined inside the integrated circuit from outside of the integrated circuit. Compared with previous methods, the proposed method can provide a precise dead-time insertion so that the dead-time setting can go to even smaller values, i.e., the dead-times can be narrowed further, which is highly beneficial for linearity, especially in applications such as class D audio amplifiers where the direction of the load alternates during its operating cycle.

According to one aspect, the invention comprises a dead-time generator for incorporation in an integrated circuit wherein the integrated circuit includes a high side and low side gate driver and wherein the high side and low side gate driver drive output switches such that a dead-time is provided between on times of the output switches, the dead-time generator comprising a circuit internal to the integrated circuit having an external dead-time setting terminal at which a dead-time setting component is connected, and wherein the dead-time generator comprises a circuit for providing a discrete dead-time for a range of dead-time setting values at the dead-time setting terminal and wherein, for a plurality of ranges of dead-time setting values at the dead-time setting terminal, the dead-time generator generates an associated plurality of discrete dead-times.

Other objects, features and advantages of the present invention will become apparent from the detailed description which follows.

BRIEF DESCRIPTION OF THE DRAWING(S)

The invention will now be described in further detail in the following detailed description with reference to the drawings in which.

DETAILED DESCRIPTION OF PREFERRED EMBODIMENTS OF THE INVENTION

Figure 1:
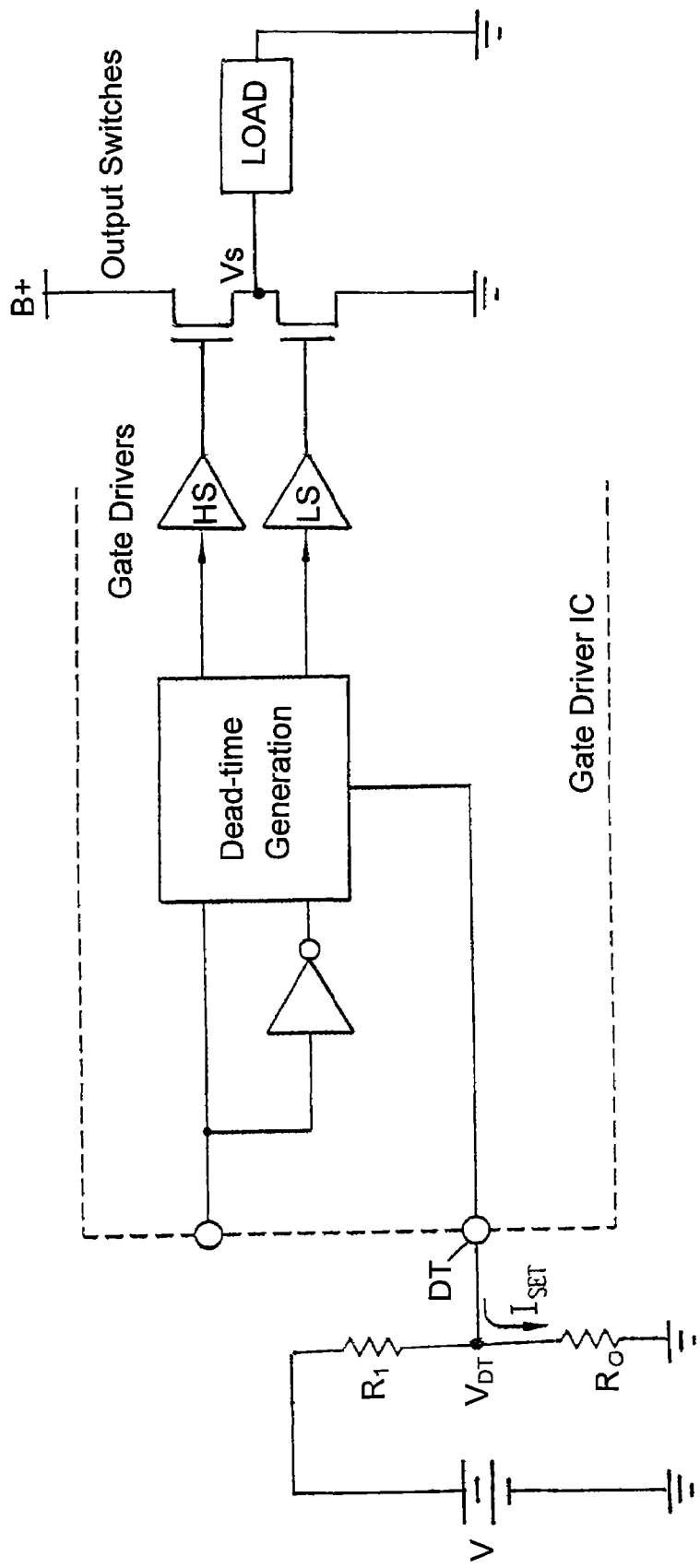
FIG. 1 shows a prior art dead-time setting circuit.
Figure 2:
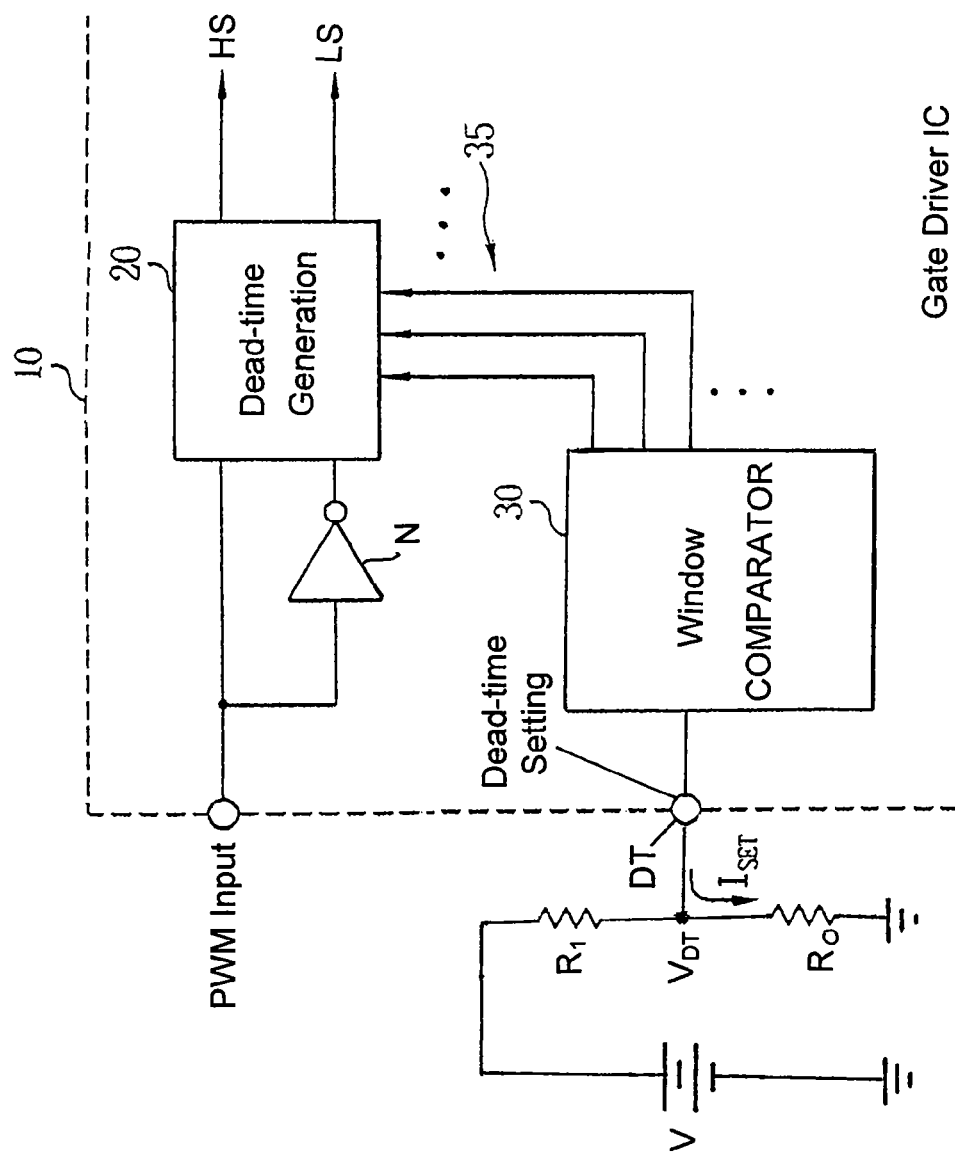
FIG. 2 shows the dead-time setting circuit according to the present invention.

FIG. 2 shows the dead-time generator according to the present invention. As shown, a gate driver integrated circuit 10 has a dead-time generation circuit 20 which provides outputs to the high side and low side drive circuits identified HS and LS. The drive circuits provide outputs to the gates of respective high side and low side power transistors, e.g., MOSFETs, (GBTs or bipolar transistors) connected in a half-bridge configuration. The dead-time generation circuit 20 ensures that the high side switch turns off before the low side switch turns on and the low side switch turns off before the high side switch turns on so that there is a defined dead-time between the on times of the two switches to prevent shoot through.

Figure 4:
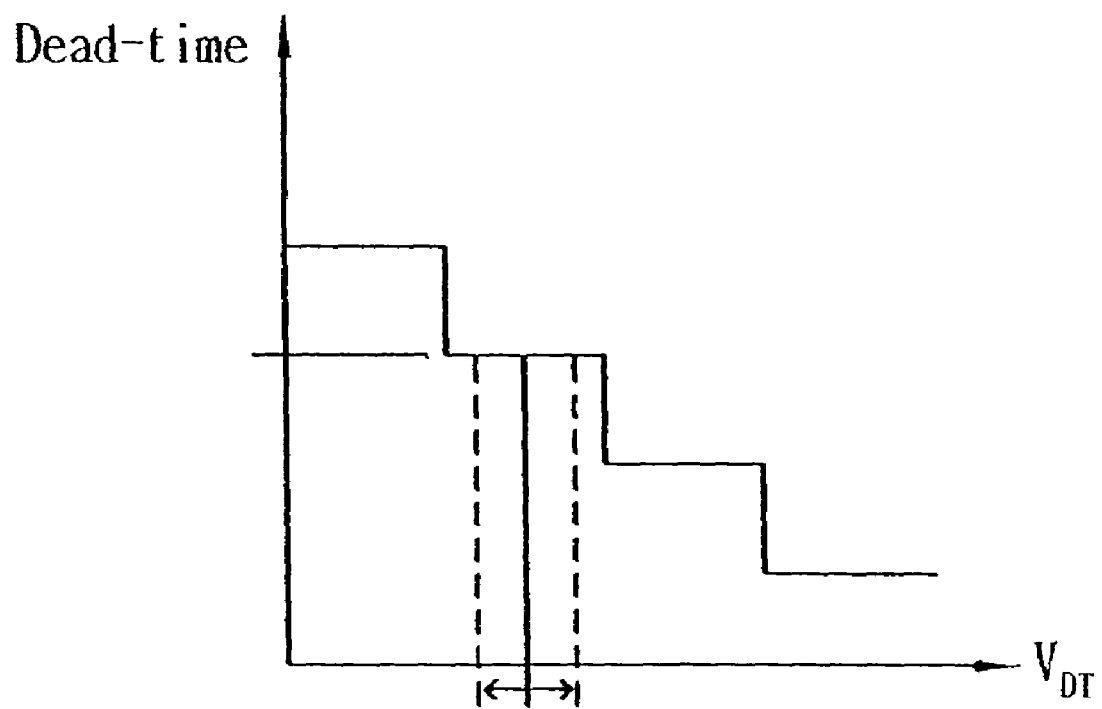
FIG. 4 shows a graph of dead-time versus input voltage for the circuit according to the present invention.

According to the invention, a window comparator circuit 30 is provided which has an input terminal DT provided externally of the integrated circuit 10. The dead-time setting is accomplished by providing a suitable voltage VDT to the dead-time setting terminal DT, for example, using a resistive voltage divider, variable voltage source, etc. The window comparator 30 compares the voltage VDT to a plurality of reference values to determine the appropriate dead-time setting. With reference to FIG. 4, depending on the value of VDT, any of a plurality of discrete dead-times, of which four are shown in FIG. 4, is set. Accordingly, as shown in FIG. 4, as VDT increases, the dead-times become progressively lower in discrete increments. The outputs 35 of the window comparator 30 then select the appropriate dead-time which is provided by the dead-time generation circuit 20 which ensures that the high side and low side switches have the selected dead-time. As shown, the dead-time generation circuit typically receives a PWM input which is inverted in one leg by an inverter N as shown to provide outputs HS and LS to the high side and low side drivers to turn the drivers on and off with the appropriate amount of dead-times between the on times.

Figure 3:
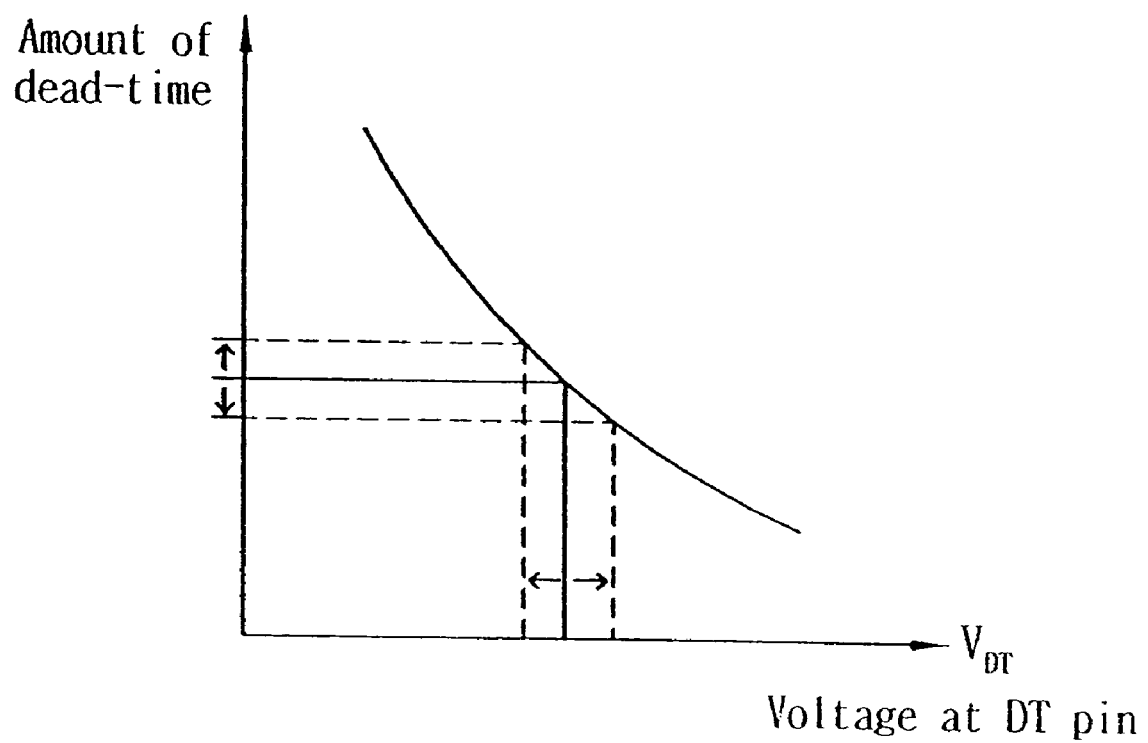
FIG. 3 shows a graph of dead-time versus input voltage for the prior art circuit.

In contrast to the prior art circuit in which the amount of dead-time varies in a continuous way (FIG. 3) with the input voltage at the DT pin, in the circuit according to the present invention, for a range of VDT, as shown by the dashed lines in FIG. 4, a discrete dead-time is set. As VDT decreases, the discrete amount of dead-time is reduced in the embodiment according to the invention according to a step-wise decreasing function. Of course, there can be direct relationship between VDT and dead-time instead of the inverse relationship shown so that as VDT increases, the dead-time also increases. Instead of a step-down function as shown in FIG. 4, there would be a step-up function.

The invention provides the following advantages:

(1) it allows several predetermined dead-time settings to be selected;

(2) dead-time is selectable from outside of the IC;

(3) each predetermined dead-time is compensated and optimized in terms of timing drift, variation over temperature, unit-to-unit variation and supply voltage dependency.

The invention is believed to be particularly useful in Class D amplifier applications where precise dead-time is crucial for linearity (low distortion). In particular, stability with temperature is becoming more important in these applications. In Class D applications, the quality of the shape of the switching waveform determines the quality of the audio signal being amplified. As an objective of Class D switching stages, fast and clean switching is desired.

An important reason for performance degradation in a switching stage is that the stray inductance in the switching current path slows down the switching speed and causes ringing. One way to eliminate this stray inductance is to place all components tightly close together.

As the gate driver IC is placed adjacent to the MOSFET which generates heat, the driver IC is heated up by the MOSFET. This is a more serious issue with surface mount MOSFETs which use a PC board as a heat sink.

Therefore, the gate driver IC has to be stable over a temperature range. The invention can provide this benefit.

Although the present invention has been described in relation to particular embodiments thereof, many other variations and modifications and other uses will become apparent to those skilled in the art. Therefore the present invention should be limited not by the specific disclosure herein, but only by the appended claims.

What is claimed is:

1. A dead-time generator for incorporation in an integrated circuit for driving high and low side output switches, wherein the integrated circuit includes a high side and low side gate driver and wherein the high side and low side gate driver drives the high and low side output switches such that a dead-time is provided between on times of the high and low side output switches, the dead-time generator comprising a first circuit internal to the integrated circuit having an external dead-time setting terminal at which a dead-time setting component is connected, and a second circuit for generating a discrete dead-time for a range of dead-time setting values at the dead-time setting terminal and wherein the discrete dead-time is generated for each of a plurality of ranges of dead-time setting values at the dead-time setting terminal.

2. The dead-time generator of claim 1, wherein the dead-time setting component sets a voltage at the dead-time setting terminal which determines the discrete dead-time generated by the second circuit.

3. The dead-time generator of claim 2, wherein as the voltage at the dead-time setting terminal decreases the dead-time decreases according to a step-wise decreasing function.

4. The dead-time generator of claim 2, wherein as the voltage at the dead-time setting terminal increases the dead-time increases according to a step-wise increasing function.

5. The dead-time generator of claim 1, wherein the dead-time setting component comprises a component establishing a voltage level at the dead-time setting terminal.

6. The dead-time generator of claim 1, wherein the first circuit comprises a window comparator circuit having a plurality of reference values for comparing a voltage at the dead-time setting terminal with the reference values and for a determining the discrete dead-time.

7. The dead-time generator of claim 6, wherein the window comparator provides a plurality of outputs to the second circuit for generating the dead-time.

8. The dead-time generator of claim 1, wherein a range of values at the dead-time setting terminal is associated with each discrete dead-time.

9. The dead-time generator of claim 1, wherein the dead-time setting component comprises a variable voltage source.

10. The dead-time generator of claim 1, wherein the dead-time setting component comprises a resistor voltage divider.

* * * * *

UNITED STATES PATENT AND TRADEMARK OFFICE
CERTIFICATE OF CORRECTION

| | | |
|---|---|---|
| PATENT NO. | : 7,724,054 B2 | Page 1 of 1 |
| APPLICATION NO. | : 11/221240 | |
| DATED | : May 25, 2010 | |
| INVENTOR(S) | : Honda et al. | |

It is certified that error appears in the above-identified patent and that said Letters Patent is hereby corrected as shown below:

In the claims, column 4, lines 33-34, "for a determining" should be changed to --for determining--.

Signed and Sealed this
Twenty-second Day of November, 2011

David J. Kappos
*Director of the United States Patent and Trademark Office*